United States Patent
Sung et al.

(10) Patent No.: US 8,017,421 B2
(45) Date of Patent: Sep. 13, 2011

(54) METHOD OF MANUFACTURING SEMICONDUCTOR LIGHT EMITTING DEVICE

(75) Inventors: Youn-joon Sung, Yongin-si (KR); Su-hee Chae, Suwon-si (KR); Tae-hoon Jang, Yongin-si (KR); Kyu-sang Kim, Seoul (KR)

(73) Assignee: Samsung LED Co., Ltd., Gyeonggi-do (KR)

( * ) Notice: Subject to any disclaimer, the term of this patent is extended or adjusted under 35 U.S.C. 154(b) by 923 days.

(21) Appl. No.: 11/889,126

(22) Filed: Aug. 9, 2007

(65) Prior Publication Data

US 2008/0102549 A1    May 1, 2008

(30) Foreign Application Priority Data

Oct. 31, 2006    (KR) .................. 10-2006-0106727

(51) Int. Cl.
*H01L 21/00*    (2006.01)

(52) U.S. Cl. ................ 438/33; 438/34; 438/46

(58) Field of Classification Search .............. 438/33, 438/34, 46

See application file for complete search history.

(56) References Cited

U.S. PATENT DOCUMENTS

| | | | |
|---|---|---|---|
| 6,468,347 B1 * | 10/2002 | Motoki et al. ................. | 117/89 |
| 6,551,848 B2 * | 4/2003 | Kwak et al. .................... | 438/22 |
| 6,562,648 B1 * | 5/2003 | Wong et al. ..................... | 438/46 |
| 6,667,186 B2 * | 12/2003 | Choi ............................... | 438/33 |
| 6,737,678 B2 * | 5/2004 | Kawakami et al. ............. | 257/79 |
| 6,884,697 B2 * | 4/2005 | Schwarzenbach et al. ... | 438/464 |
| 6,924,513 B2 * | 8/2005 | Akaike et al. .................... | 257/98 |
| 7,041,523 B2 * | 5/2006 | Kawakami et al. ............. | 438/33 |
| 7,109,053 B2 * | 9/2006 | Kuroda et al. .................. | 438/33 |
| 7,667,224 B2 * | 2/2010 | Ohashi et al. ................... | 257/13 |
| 7,687,374 B2 * | 3/2010 | Sung et al. ..................... | 438/460 |
| 7,724,793 B2 * | 5/2010 | Kawakami et al. ........ | 372/43.01 |
| 2004/0026700 A1 * | 2/2004 | Akaike et al. .................... | 257/79 |
| 2004/0191942 A1 * | 9/2004 | Kawakami et al. ............. | 438/33 |
| 2005/0093009 A1 * | 5/2005 | Kuramoto ....................... | 257/98 |
| 2006/0202219 A1 * | 9/2006 | Ohashi et al. ................... | 257/98 |
| 2007/0121692 A1 * | 5/2007 | Kawakami et al. ........ | 372/43.01 |
| 2007/0145883 A1 * | 6/2007 | Ohashi et al. ................. | 313/498 |
| 2008/0102549 A1 * | 5/2008 | Sung et al. ....................... | 438/34 |
| 2008/0258269 A1 * | 10/2008 | Um ................................. | 257/623 |
| 2009/0142874 A1 * | 6/2009 | Arai ................................ | 438/57 |
| 2009/0155939 A1 * | 6/2009 | Sung et al. ..................... | 438/28 |
| 2010/0136735 A1 * | 6/2010 | Arai ................................ | 438/72 |
| 2010/0224894 A1 * | 9/2010 | Kim et al. ....................... | 257/98 |

\* cited by examiner

*Primary Examiner* — Laura M Menz (74) *Attorney, Agent, or Firm* — Harness, Dickey & Pierce, PLC (57) ABSTRACT

Provided is a method of manufacturing semiconductor light emitting devices including: forming light emitting structures by sequentially depositing a first material layer, an active layer and a second material layer; forming the roughness pattern on a region of the bottom of a substrate except at least a cleaving region for forming cleaving planes; and forming n-electrodes.

12 Claims, 9 Drawing Sheets

METHOD OF MANUFACTURING SEMICONDUCTOR LIGHT EMITTING DEVICE

CROSS-REFERENCE TO RELATED PATENT APPLICATION

This application claims the benefit of Korean Patent Application No. 10-2006-0106727, filed on Oct. 31, 2006, in the Korean Intellectual Property Office, the disclosure of which is incorporated herein in its entirety by reference.

BACKGROUND OF THE INVENTION

1. Field of the Invention

The present invention relates to a method of manufacturing a semiconductor light emitting device, and more particularly to a method of manufacturing a semiconductor light emitting device to improve quality of cleaving planes.

2. Description of the Related Art

A semiconductor light emitting device mainly refers to a laser diode (LD), and to a light emitting diode (LED). A light emergence face of a semiconductor light emitting device needs to be perpendicular to an oscillation layer and the surface of the light emergence face needs to be smooth to lower the operating power and increase power output of the semiconductor light emitting device. When the light emergence face is formed by dry etching, the surface can become damaged and rough thereby causing large loss of light and low reproducibility. On the other hand, loss of light is small in cleaving planes formed by a scribing process. Accordingly, nitride semiconductor light emitting devices usually use cleaving planes as a light emergence face.

A GaN substrate, a sapphire substrate, a SiC substrate, etc. are used for epitaxial growth to form light emitting structures. When using a GaN substrate, lattice constants of the nitride semiconductor layers are generally the same as lattice constants of GaN substrates since nitride semiconductor layers of the same kind as the GaN substrate are grown on the surface of the GaN substrate. Thus, nitride semiconductor layers of high quality can be obtained, and internal stress in the nitride semiconductor layers is largely decreased compared to using substrates of other kinds. Additionally, a GaN substrate has a high heat conductivity compared to a sapphire substrate and thus has an excellent heat dissipating effect, which is a great merit in view of life span and efficiency of semiconductor light emitting devices. Also, the cleaving planes have high optical quality because a GaN substrate is cleaved together with nitride semiconductor layers. When using a GaN substrate, more devices can be obtained from a single substrate since vertical electrodes can be formed on the GaN substrate. However, forming ohmic contact is not easy when forming electrodes on the bottom surface of GaN substrate.

To easily form ohmic contact, a technique forming a roughness pattern on the bottom surface of a GaN substrate has been suggested. However, the roughness pattern on the bottom surface of the GaN substrate causes diffused reflection due to the roughness of the surface and thus the bottom surface of the GaN substrate seems opaque. Generally, to form cleaving planes, a groove is formed on a bottom surface of semiconductor light emitting devices. Then, external force is applied to generate stress in the deepest portion of the groove and the semiconductor light emitting device is cleaved together with a substrate, thereby forming cleaving planes. However, when the GaN substrate is opaque, forming a groove in a precise position becomes difficult and surface roughness of cleaving planes increases.

SUMMARY OF THE INVENTION

The present invention provides a manufacturing method of semiconductor light emitting devices for improving quality of cleaving planes. According to an aspect of the present invention, there is provided a method of manufacturing semiconductor light emitting devices comprising: forming light emitting structures by sequentially depositing a first material layer, an active layer and a second material layer on a substrate; forming a roughness pattern on a region of the bottom of the substrate at least except a cleaving region for forming a cleaving plane; forming n-electrodes on the region where the roughness pattern is formed.

As an embodiment, the forming the roughness pattern is performed by forming the roughness pattern on a region at least except the cleaving region and a separating region orthogonal to the cleaving region.

As an embodiment, the forming of the roughness pattern comprises forming the roughness pattern only on the region where the n-electrodes are formed.

As an embodiment, the substrate is a GaN substrate.

As an embodiment, the forming of the roughness pattern comprises masking a region where the roughness pattern will not be formed using a protection material and wet etching the other region using an alkaline solution.

As an embodiment, a maskless dry etching process is used in the forming of the roughness pattern.

As an embodiment, the method of manufacturing the semiconductor light emitting devices further comprises forming a plurality of ridges in the second material layer and forming a first p-electrode on each of the plurality of ridges.

As an embodiment, the method further comprises forming second p-electrodes on the region of the plurality of light emitting structures except the cleaving region.

As an embodiment, the second p-electrodes are formed on the region except the cleaving region and separating region orthogonal to the cleaving region.

According to another aspect of the present invention, a method of manufacturing semiconductor light emitting devices comprising: forming a plurality of light emitting structures by sequentially depositing a first material layer, an active layer and a second material layer and forming a plurality of ridges in the second material layer; forming a first p-electrode on each of the plurality of ridges; and forming second p-electrodes on the region of the plurality of light emitting structures except the cleaving region for forming cleaving planes.

As an embodiment, the second p-electrodes formed on each light emitting structure are separated.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The drawings may be exaggerated to clearly illustrate features of semiconductor light emitting devices according to embodiments of the present invention. The semiconductor light emitting devices below are GaN III-V nitride semiconductor laser light emitting devices.

Figure 1A:
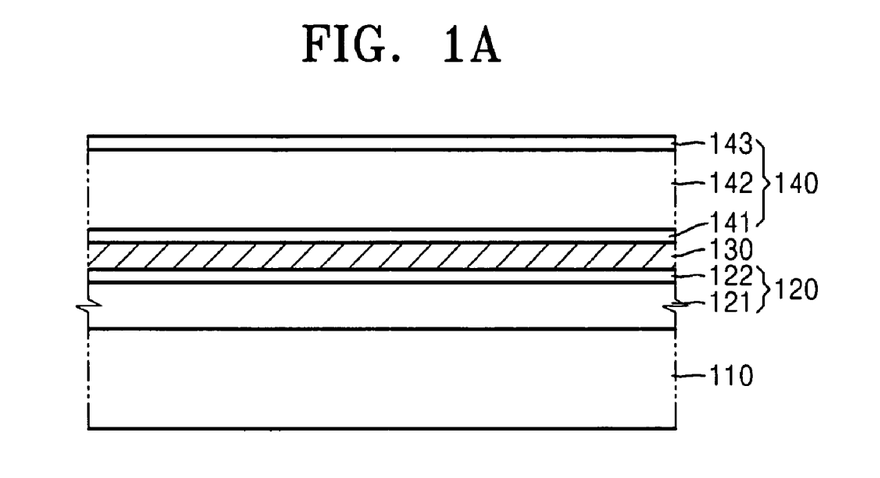
FIG. 1A is a cross-sectional view illustrating a process of depositing a first material layer, an active layer and a second material layer on a substrate.

Referring FIG. 1A, a first material layer 120, an active layer 130 and a second material layer 140 are sequentially deposited on a substrate 110, using various deposition methods such as a sequential epitaxial growth of the first material layer 120, the active layer 130 and the second material layer 140 on the substrate 110.

The substrate 110 can be a III-V nitride semiconductor substrate such as a GaN substrate, a SiC substrate, or the like, or a highly resistive substrate such as a sapphire substrate.

The first material layer 120 includes a first clad layer 121. The first clad layer 121 is, for example, a n-AlGaN/GaN layer. A first waveguide layer 122 is a GaN-based Group III-V nitride semiconductor layer, that is, n-GaN layer. The first waveguide layer 122 has a refractive index lower than that of the active layer 130 and higher than that of the first clad layer 121.

The active layer 130 is a material layer emitting light by coupling of carriers such as electrons and holes, and may be a GaN-based Group III-V nitride semiconductor layer having a multi-quantum well (MQW) structure. The active layer 130 may be a material layer formed by adding Indium (In) to the GaN based Group III-V nitride semiconductor layer at a predetermined ratio, for example, an InGaN layer.

The second material layer 140 includes a second waveguide 141, a second clad layer 142 and a cap layer 143. The refractive index of the second waveguide layer 141 is lower than that of the active layer 130 and higher than that of the second clad layer 142. The second clad layer 142 is formed of the same substance as the first clad layer 121 except that the second clad layer 142 is doped with a p type material. The second waveguide 141 may be a p-GaN layer which is a GaN III-V nitride compound semiconductor layer. The cap layer 143 may be a direct transfer type GaN III-V nitride compound semiconductor layer doped with p type conductive impurities. It may preferably be a p-GaN layer, or it can be an AlGaN or InGaN layer containing a predetermined proportion of Al or In respectively.

The first clad layer 121, the active layer 130 and the second clad layer 142 can be formed of $Al_xGa_{1-x}In_yN_{1-y}$ (where $0 \leq x \leq 0.3$, $0 \leq y \leq 0.3$) for example.

Figure 1B:
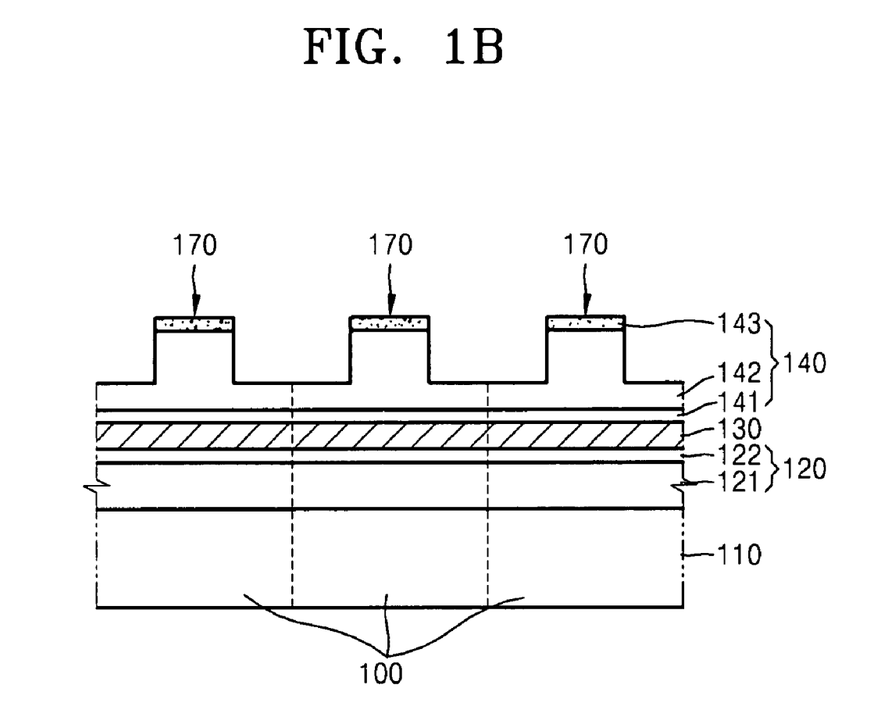
FIG. 1B is a cross-sectional view illustrating a process of forming ridges.

Next, a plurality of ridges 170 protruding upward are formed to supply electric current to a limited area of the second clad layer 142, as illustrated in FIG. 1B, by etching the second clad layer 142 and cap layer 143. Therefore, a plurality of light emitting structures 100, each of which includes one ridge 170, are formed.

Figure 1C:
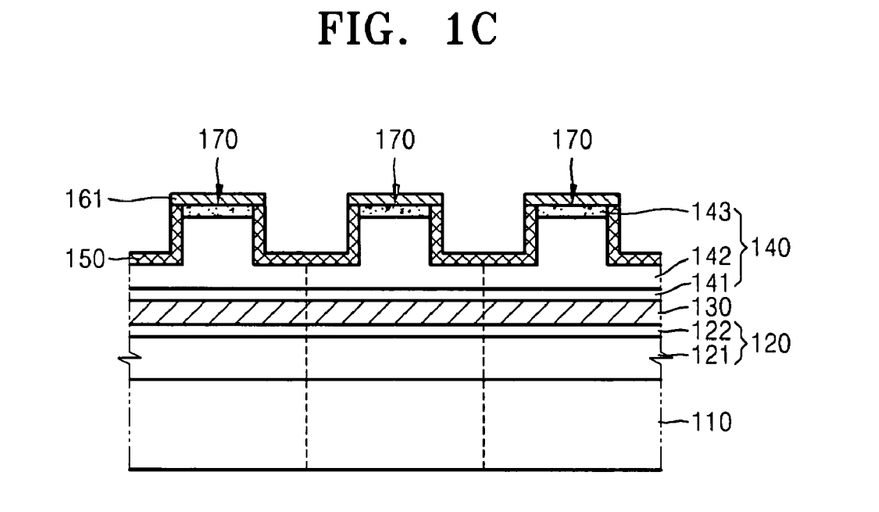
FIG. 1C is a cross-sectional view illustrating a process of forming first p-electrodes.

Then, as illustrated in FIG. 1C, first p-electrodes 161 are formed on the ridges 170. The first p-electrodes 161 are contact layers which electrically contact the cap layer 143.

According to an alternative sequence, after forming the first p-electrodes 161 on the cap layer 143, the plurality of ridges 170 protruding upward can be formed by etching the second clad layer 142, the cap layer 143 and the first p-electrodes 161.

A current limit layer 150 is formed on the clad layer 142 and is not formed on the first p-electrodes 161.

Figure 2A:
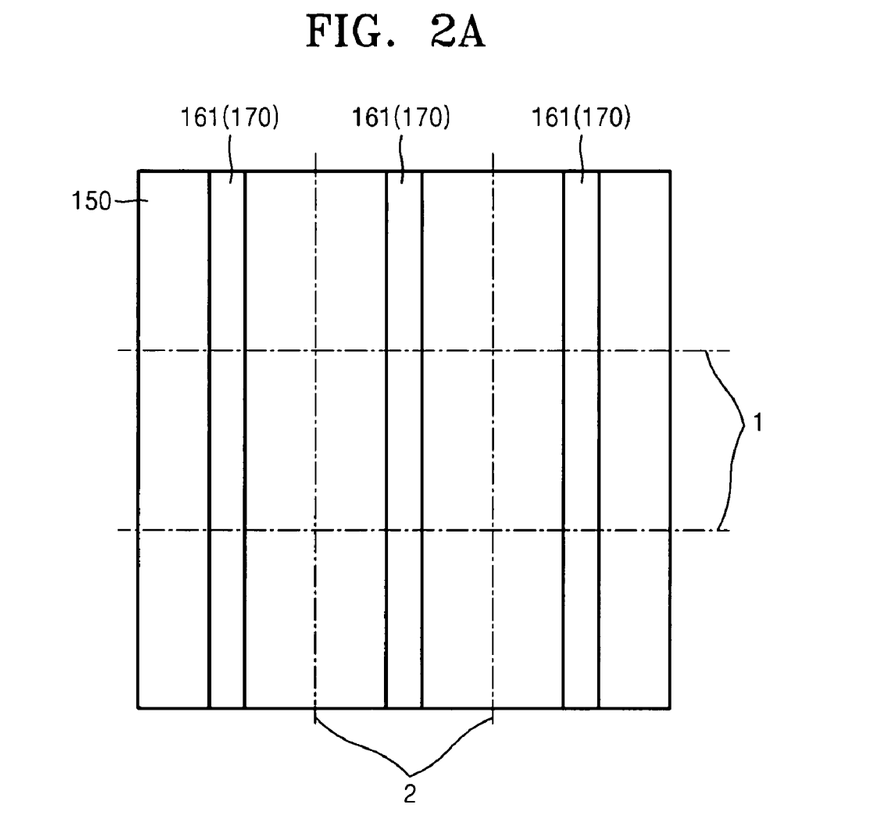
FIG. 2A is a plan view of FIG. 1C.

A plan view of a semiconductor light emitting device manufactured according to the above process is illustrated in FIG. 2A. Hereinafter, a process of forming p-second electrodes 162 on the upper surface of light emitting structures 100 is described with reference to FIGS. 2A through 2D.

The second p-electrodes 162 are bonding metal layers to accommodate bonding wires or submounts for supplying electric current to the second material layer 140 for example. The first p-electrodes 161 and second p-electrodes 162 are altogether referred to as p-electrodes.

Figure 2B:
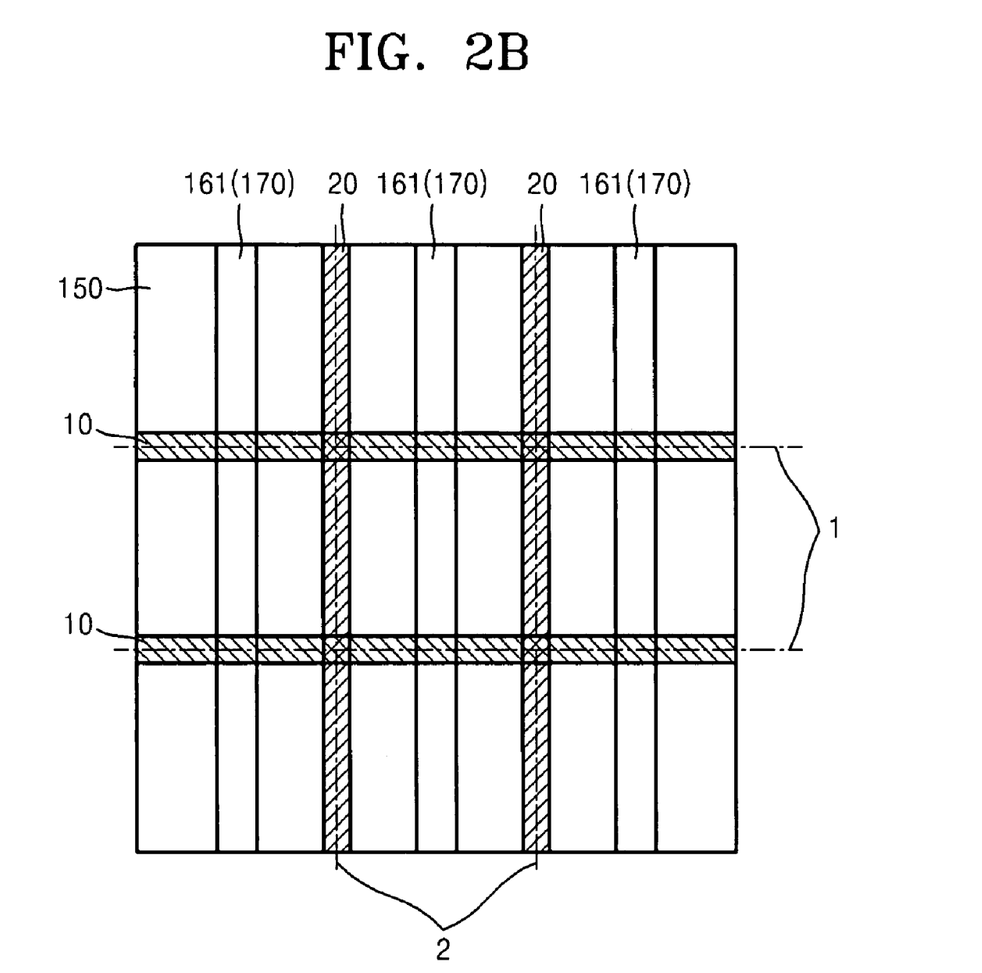
FIG. 2B is a plan view illustrating a state in which a cleaving region and a separating region are masked prior to forming second p-electrodes.

A cleaving region 10 including cleaving lines 1 is masked, as illustrated in FIG. 2B, prior to forming second p-electrodes 162 using a protection material. Further, a region including separating lines 2 orthogonal to the cleaving lines 1 also can be masked using the protection material. The separating lines 2 are approximately parallel to the ridges 170 and disposed between the ridges 170. The cleaving lines 1 and separating lines 2 are not actual lines but are imaginary lines for cleaving and separating semiconductor light emitting devices in a manufacturing process.

Figure 2C:
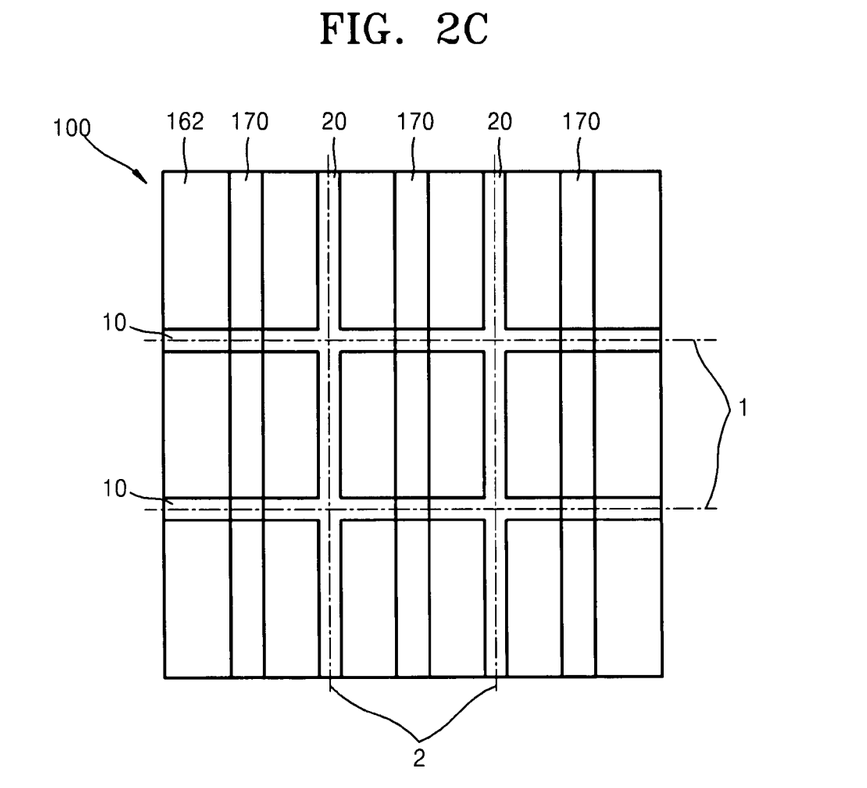
FIG. 2C is a plan view illustrating a state in which the second p-electrodes are formed.
Figure 2D:
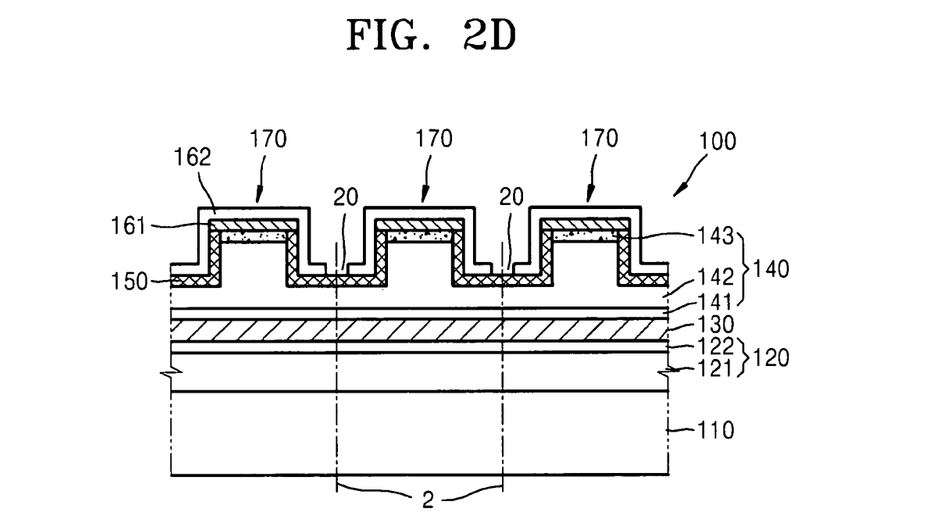
FIG. 2D is a cross-sectional view of the state of FIG. 2C.

Next, a metal material is deposited on an unmasked region to form the second p-electrodes 162 and then the protection material is removed, so that the second p-electrodes 162 that are separated into units corresponding to each light emitting structure 100 by the cleaving region 10 and the separating region 20 are formed as illustrated in FIGS. 2C and 2D.

Referring to FIGS. 3A through 3D, a process of forming n-electrodes 180 on a bottom surface of substrate 110, where the substrate 110 may be a GaN substrate, is illustrated.

Figure 3A:
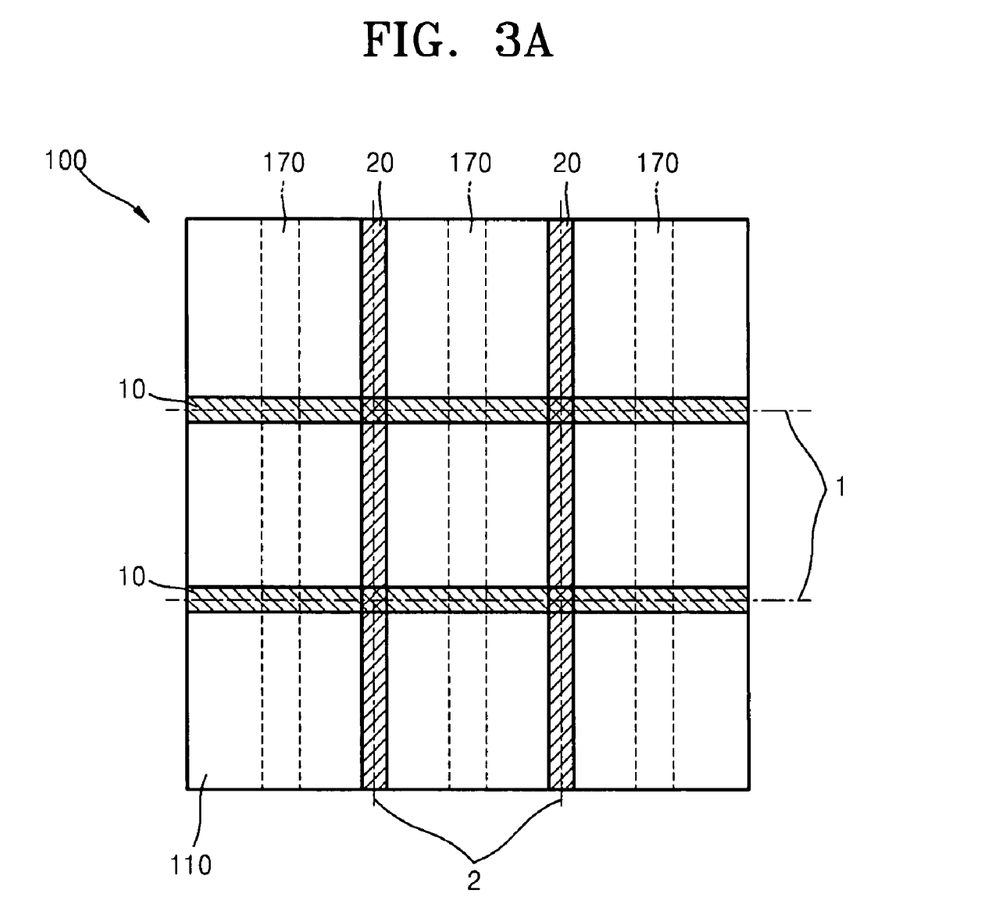
FIG. 3A is a bottom view illustrating a state in which a cleaving region and a separating region of a bottom surface of a substrate are masked prior to forming a roughness pattern on the bottom surface of the substrate.

A roughness pattern may be formed on the bottom surface of substrate 110 to form a satisfactory ohmic contact between the substrate 110 and n-electrodes 180, where the roughness pattern may be formed on a region except the cleaving region 10 including the cleaving lines. For this, as illustrated in FIG. 3A, the cleaving region 10 including at least the cleaving lines 1 of the substrate 110 are masked using a protection material. The protection material can be a photoresist material or a hard mask material such as $SiO_2$, $TiO_2$, $Al_2O_3$, etc. The separating region 20 including the separating lines 2 also can be masked using the protection material to help separate the semiconductor light emitting devices.

Figure 3B:
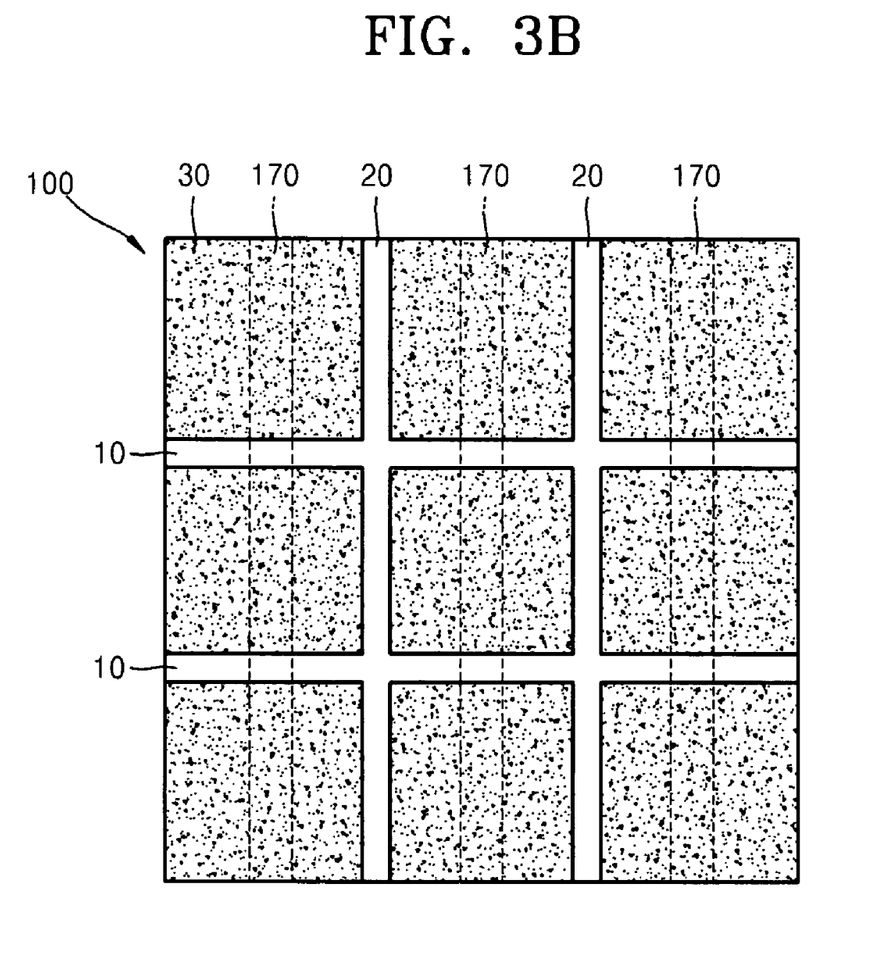
FIG. 3B is a bottom view illustrating a state in which the roughness pattern is formed on the region of the bottom of the substrate except the cleaving region and the separating region.

Next, the roughness pattern 30 is formed on the bottom surface of substrate 110 by etching the unmasked region using an alkaline solution such as KOH, NaOH, or the like. As a result, the roughness pattern 30 is formed on the region except the cleaving region 10 and separating region 20 as illustrated in FIG. 3B. The roughness pattern 30 can also be formed using a maskless dry etching process.

Figure 3C:
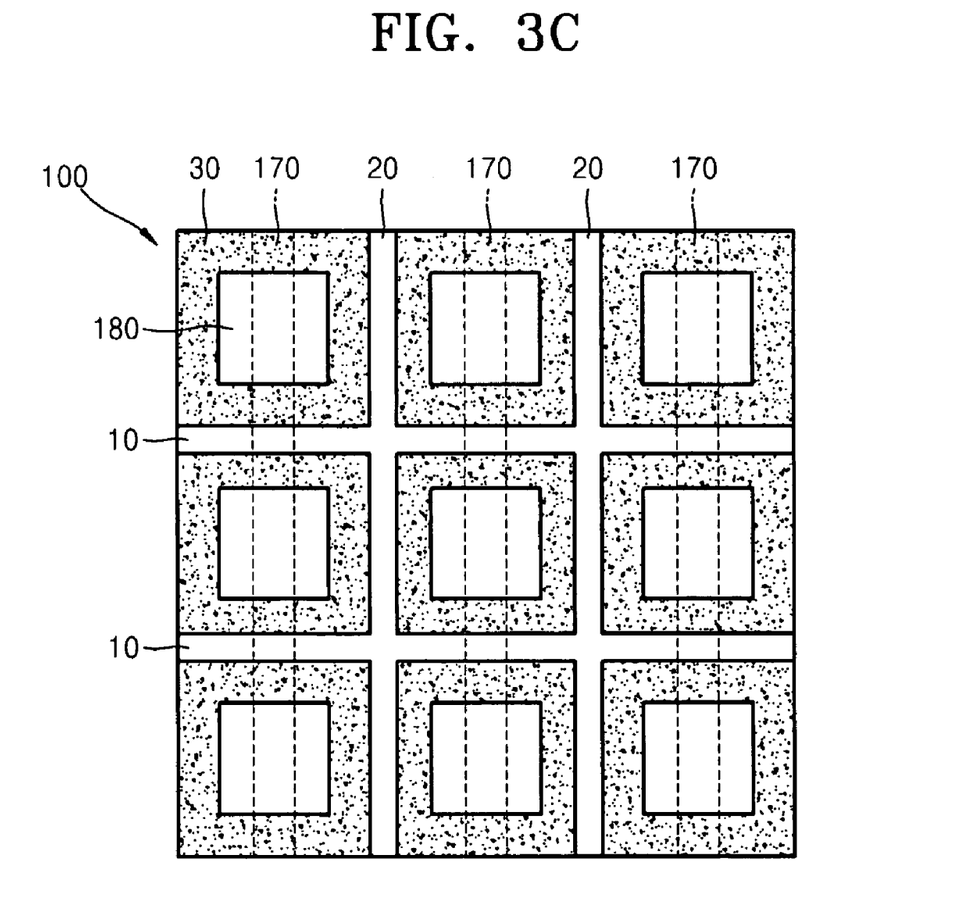
FIG. 3C is a bottom view illustrating a state in which n-electrodes are formed in the region where the roughness pattern is formed.

Then, the n-electrodes 180 are formed on the entire region or a portion of the region where the roughness pattern 30 is formed as illustrated in FIG. 3C. The n-electrodes 180 can be formed by depositing a metal material, and methods of forming the n-electrodes 180 are not limited to a particular method.

Figure 3D:
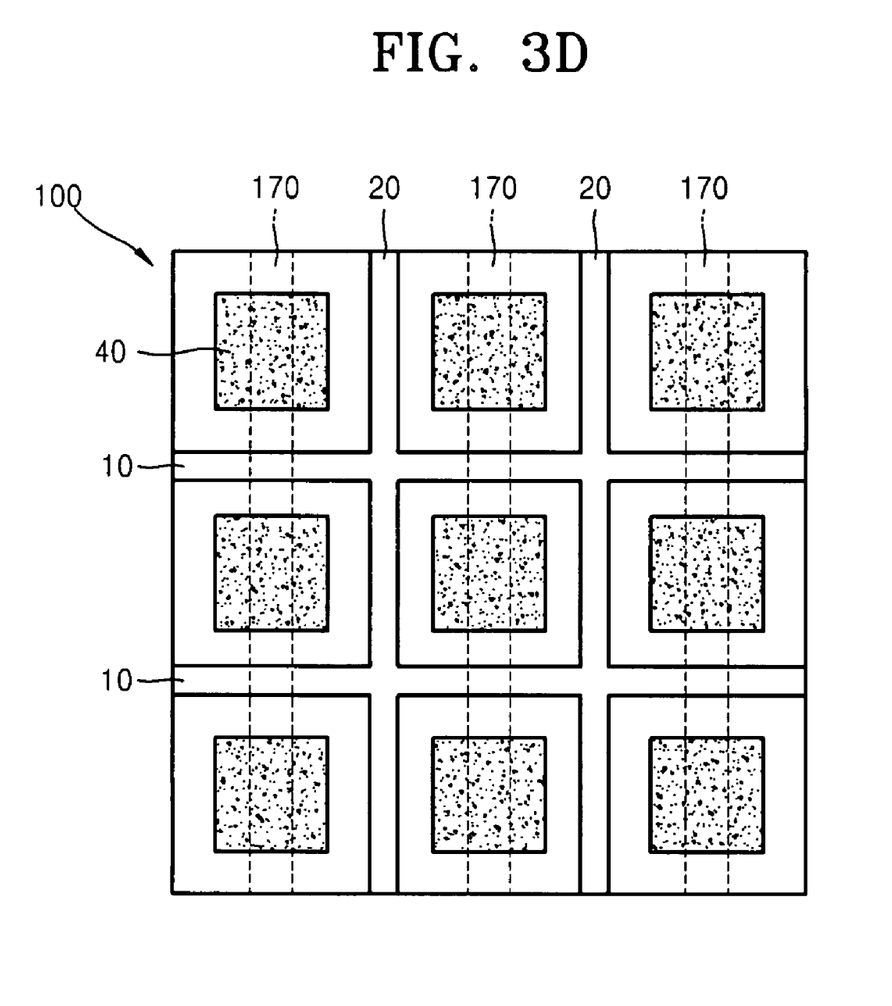
FIG. 3D is a bottom view illustrating another embodiment in which the roughness pattern is formed only in a region of a bottom surface of substrate where n-electrodes are to be formed.

Alternatively, a region of the bottom of substrate 110 except region 40 for forming the n-electrodes 180 upon is masked as illustrated in FIG. 3D in order to form the roughness pattern on a region except at least the cleaving region 10 or more preferably except the cleaving region 10 and the separating region 20. Then, the roughness pattern is formed by etching only the region 40 for forming the n-electrodes 180 upon, and the n-electrodes 180 are formed on the region 40.

Figure 4:
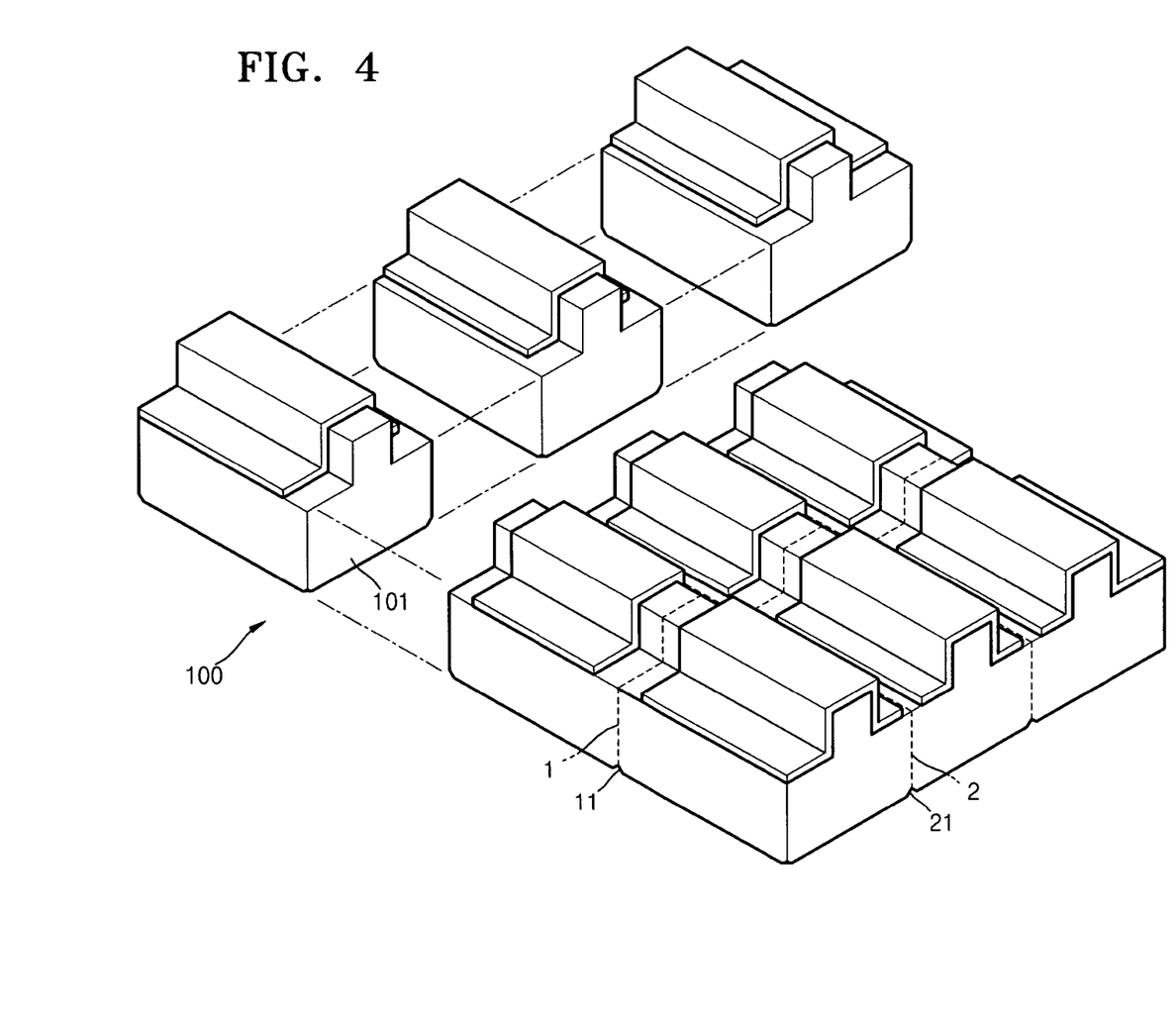
FIG. 4 is a perspective view illustrating the completed product of manufacturing semiconductor light emitting devices using cleaving and separating processes.

After forming the plurality of light emitting structures 100 according to the processes above, the cleaving grooves 11 are formed along the cleaving lines 1 in the cleaving region 10 on the bottom of substrate 110 as illustrated in FIG. 4. Then, force is applied to the substrate 110 and the substrate 110 and the plurality of light emitting structures 100 are cleaved along the cleaving lines 1 to form cleaving planes 101. Also, separating grooves 21 are formed along the separating lines 2 in the separating region 20, and force is applied to the substrate 110 to cleave the substrate 110 and the plurality of light emitting structures 100 along the separating lines 2. Alternatively, the cleaving grooves 11 and separating grooves 21 can be formed before cleaving and separating. In addition, the order of cleaving and separating does not limit the scope of the present invention. By performing the above processes, a plurality of semiconductor light emitting diodes can be manufactured by growing a plurality of light emitting structures 100 on one substrate 110 and then by cleaving the light emitting structure 100 together with the substrate 110 to separate a plurality of individual semiconductor light emitting diodes. Meanwhile, if the second p-electrodes 162 are formed on the entire region of the current limit layer 150 and the first p-electrodes 161, the second p-electrodes 162 are cleaved and separated in the process of cleaving along the cleaving lines 1. The second p-electrodes 162 are metal materials and have high ductility compared to the layers of semiconductor materials forming the light emitting structures 100. Therefore, when forming the cleaving planes 101, the metals can extend beyond the cleaving planes 101. However, this defective factor is fundamentally excluded due to the methods of manufacturing semiconductor light emitting devices according to the present invention because the second p-electrodes 162 are formed in the region except the cleaving region 10. Further, the light emitting structures 100 can be electrically shorted in the process of cleaving and separating along the cleaving lines 1 and separating lines 2 due to the extended second p-electrodes 161 when the second p-electrodes 162 are formed on the entire surface of current limit layer 150 and first p-electrodes 161. According to the methods of manufacturing semiconductor light emitting devices of the present invention, this defective factor can be prevented by forming the second p-electrodes 162 in the region except the cleaving region 10 and separating region 20.

In addition, the bottom of the GaN substrate 110 is an N-face which is a 000-1 surface. An N-face and n-electrodes 180 are not likely to form satisfactory ohmic bonding. To address this, the roughness pattern is formed on the bottom of substrate 110 to increase the surface area and form satisfactory ohmic bonding. Therefore, forming the roughness pattern on the bottom of the substrate 110 lowers the operating voltage of semiconductor light emitting devices and thus is effective in manufacturing devices that operate with low power. However, the roughness pattern formed on the bottom of substrate 110 increases roughness of the cleaving planes 101 and causes deterioration in light quality. In addition, the roughness pattern makes the bottom of substrate 110 look opaque, and thus hinders forming the cleaving grooves 11 and separating grooves 21 exactly in the cleaving lines 1 and separating lines 2. However, according to the manufacturing methods of the present invention, the roughness pattern is formed only in the region except the cleaving region 10 and the separating region 20 and thus the above drawbacks can be addressed.

Moreover, the cleaving region 10 and separating region 20 have widths of approximately 5 through 10 μm, and thus they can function as useful reference lines for cleaving and separating. Therefore, the cleaving and separating lines can be formed in the process of forming the roughness pattern on the bottom of substrate 110, and thus the manufacturing processes of semiconductor light emitting devices can be simplified.

In addition, manufacturing processes of semiconductor light emitting devices can be stabilized due to the above effects and thus production yield can be increased.

The above embodiments are described referring to nitride semiconductor laser light emitting devices as examples. However the present invention is not limited thereto. It would be understood by those of ordinary skill in the art that the manufacturing methods of semiconductor light emitting devices according to the present invention can also be applied to the manufacturing methods of semiconductor LED devices.

Effects of the manufacturing methods of semiconductor light emitting devices according to the present invention are as below.

First, a satisfactory ohmic bonding between a substrate and n-electrodes can be obtained and heat can be dissipated effectively through the substrate by forming the roughness pattern on the bottom of the substrate. In addition, cleaving planes having excellent quality can be formed.

Second, the cleaving region and separating region can function as useful cleaving and separating reference lines by themselves. Therefore, the cleaving and separating reference lines can be formed in the process of forming the roughness pattern on the bottom of the substrate and thus the manufacturing process of semiconductor light emitting devices can be simplified.

Third, the manufacturing process of semiconductor light emitting devices can be stabilized due to the above effects and thus product yield can be increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing semiconductor light emitting devices comprising:
   forming light emitting structures by sequentially depositing a first material layer, an active layer and a second material layer on a substrate;
   forming a roughness pattern on a region of the bottom of the substrate at least except a cleaving region for forming a cleaving plane;

forming n-electrodes on the region where the roughness pattern is formed.

2. The method of claim 1, wherein forming the roughness pattern is performed by forming the roughness pattern on a region at least except the cleaving region and a separating region orthogonal to the cleaving region.

3. The method of claim 1, wherein the forming of the roughness pattern comprises forming the roughness pattern only on the region where the n-electrodes are formed.

4. The method of claim 1, wherein the substrate is a GaN substrate.

5. The method of claim 1, wherein the forming of the roughness pattern comprises masking a region where the roughness pattern will not be formed using a protection material and wet etching the other region using an alkaline solution.

6. The method of claim 5, wherein the protection material is selected from a photoresist material and a hard mask material such as SiO2, TiO2, Ai2O3, and the like.

7. The method of claim 5, wherein the alkaline solution includes KOH and NaOH.

8. The method of claim 1, wherein a maskless dry etching process is used in the forming of the roughness pattern.

9. The method of claim 1, further comprising forming a plurality of ridges in the second material layer and forming a first p-electrode on each of the plurality of ridges.

10. The method of claim 9, further comprising forming second p-electrodes on the region of the plurality of light emitting structures except the cleaving region.

11. The method of claim 10, wherein the second p-electrodes are formed on the region except the cleaving region and separating region orthogonal to the cleaving region.

12. The method of claim 11, wherein the substrate is a GaN substrate.

\* \* \* \* \*